TUNED TRANSISTOR AMPLIFIERS HAVING INCREASED EFFICIENCY

Filed March 2, 1964 2 Sheets-Sheet 1

INVENTORS
Boleslaw Marian Sosin
and
Roger Edwin John Gerard
BY Baldwin & Wight
ATTORNEYS

TUNED TRANSISTOR AMPLIFIERS HAVING INCREASED EFFICIENCY

Filed March 2, 1964

INVENTORS
Boleslaw Marian Sosin
Roger Edwin and John Gerard
BY Baldwin & Wight
ATTORNEYS United States Patent Office 3,325,745
Patented June 13, 1967

3,325,745

TUNED TRANSISTOR AMPLIFIERS HAVING INCREASED EFFICIENCY

Boleslaw Marian Sosin, Chelmsford, Essex, and Roger Edwin John Gerard, Chiswick, London, England, assignors to The Marconi Company Limited, London, England, a British company Filed Mar. 2, 1964, Ser. No. 348,433
Claims priority, application Great Britain, Mar. 8, 1963, 9,222/63
2 Claims. (Cl. 330—13)

Figures 1, 2, 3, 4, 9:
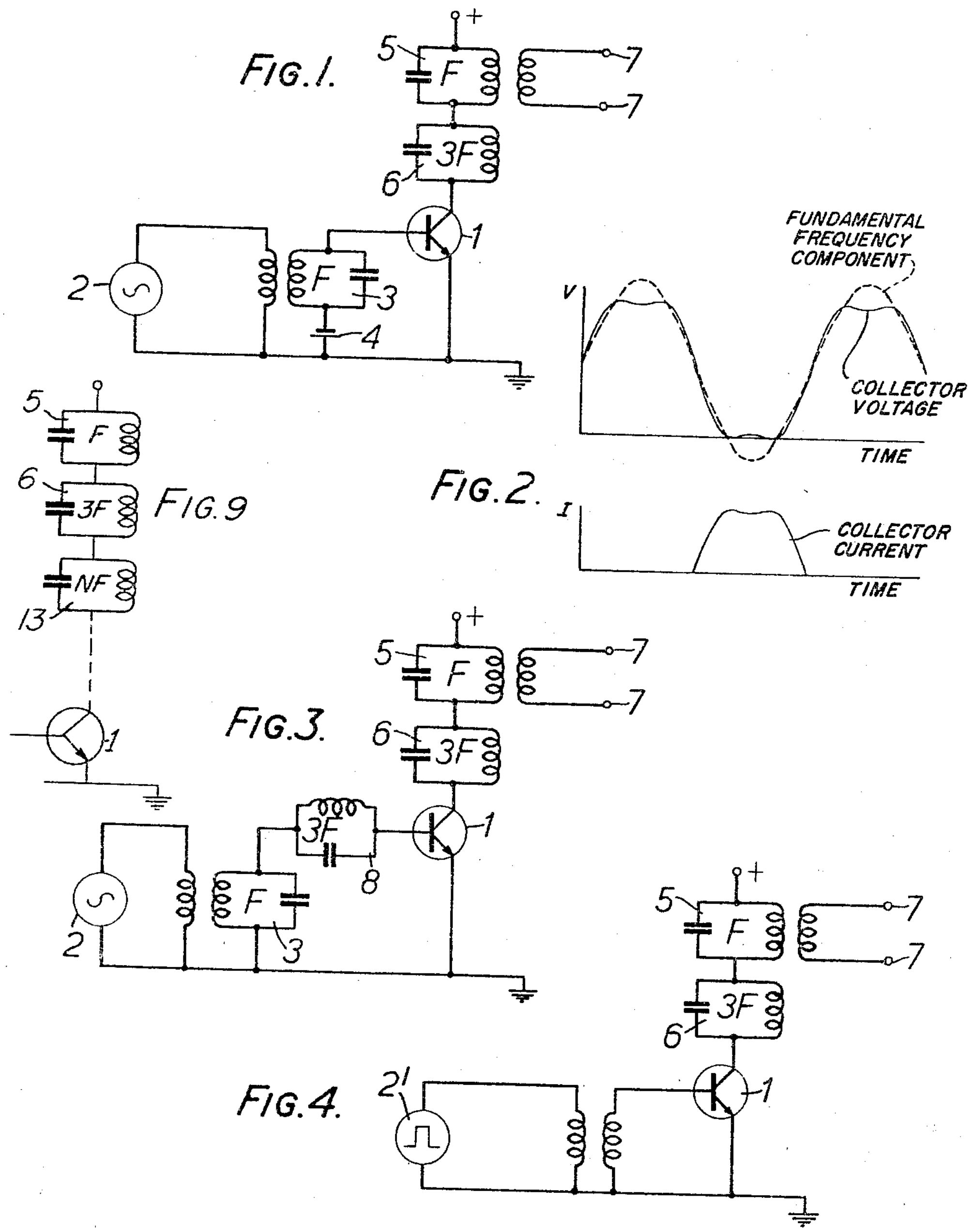

This invention relates to transistor amplifier circuits and is applicable particularly to amplifiers in which efficiency of power conversion from D.C. to A.C. is an important factor.

In accordance with this invention, it has been found possible to increase the efficiency of an amplifying transistor by providing in the output circuit harmonics of the fundamental frequency to be amplified, with the harmonics in the voltage waveform being different from those in the current waveform. It is possible in this way to reduce losses in the transistor and thereby to reduce limitations imposed by temperature considerations as to maximum output power from a given transistor. The present invention therefore provides an arrangement which allows high efficiency and low operating temperatures in transistor amplifiers.

According to this invention, there is provided a transistor amplifier comprising a transistor, means for applying input signals of given frequency to the base of said transistor, a pair of tuned circuits resonant respectively at said given frequency and at three times said frequency coupled in series with the emitter-collector circuit of said transistor, and means for taking off amplified output signals at said given frequency from the corresponding tuned circuit, the drive to the base of said transistor being adapted to produce a relatively low value of peak transistor current and a relatively high value of mean transistor current to provide high efficiency of operation and high peak power capacity for said transistor.

Because of the low peak current and high means current, the power handling capacity of a given transistor is increased, and its conversion efficiency is also increased. Another advantage of the invention is that it reduces the peak voltage across the transistor.

The invention is not limited to the provision of only tuned circuits which are resonant at said given frequency and at three times said frequency. One or more further tuned circuits resonant at harmonics higher than the third can be added if desired. The third harmonic circuit is essential, but the addition of one or more higher harmonic circuits is a refinement resulting in squarer waveforms, which may be desirable in some embodiments of the invention.

The drive to the base of the transistor should be adapted to give an angle of current flow of substantially 120°. This may be achieved by including in the base circuit of the transistor a tuned circuit resonant at the signal source frequency in series with a bias source whose value is selected to result in the required 120° angle of current flow. In another way of carrying out the invention, there is included in the base circuit of the transistor a tuned circuit resonant at the signal source frequency in series with a tuned circuit resonant at three times said frequency. In a further way of carrying out the invention, the base of the transistor is driven by a substantially rectangular wave form resulting in the required 120° angle of current flow.

The invention is applicable to push-pull amplifiers as well as to single ended amplifiers. In one form of push-pull amplifier in accordance with this invention, two transistors of the same type (i.e. both NPN or both PNP) are provided with their emitters connected together, and a tuned circuit resonant at three times the signal frequency is included in each of the transistor collector circuits, the divided push-pull output circuit being completed by a tuned circuit resonant at the signal frequency. In another form of push-pull embodiment, two transistors of opposite types are provided with their collectors connected together and coupled to a common collector circuit having a tuned circuit resonant at the signal frequency in series with a tuned circuit resonant at three times said signal frequency.

Figures 5, 6:
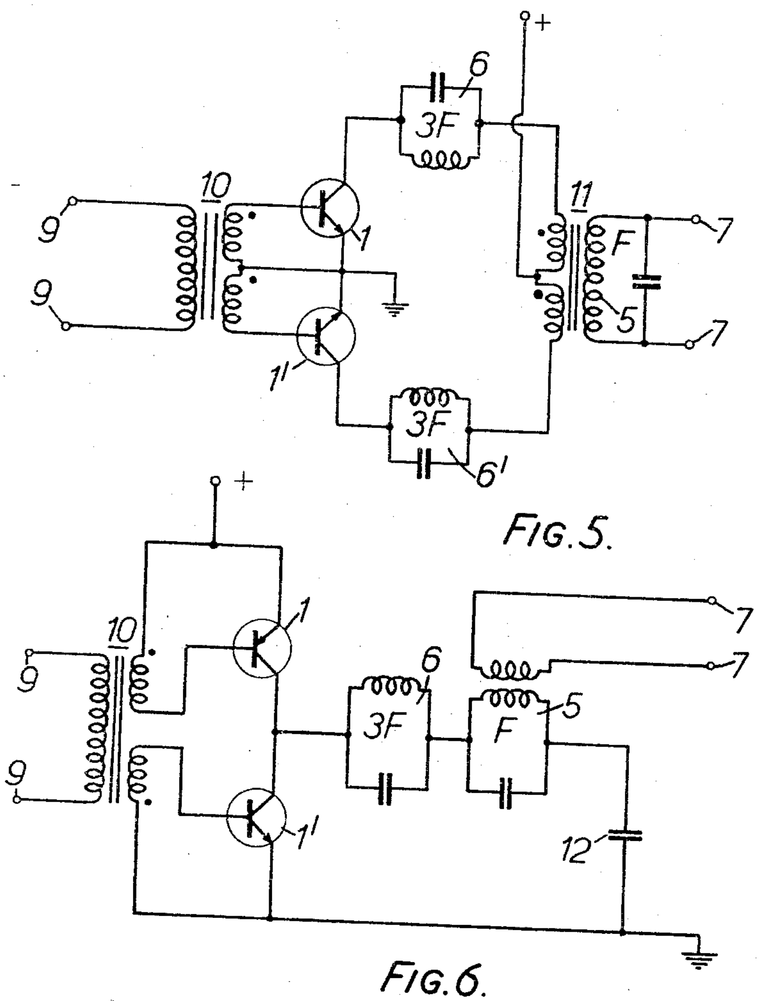
Figure 7:
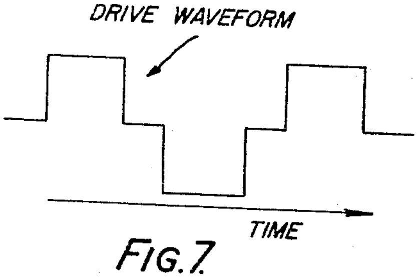
Figure 8:
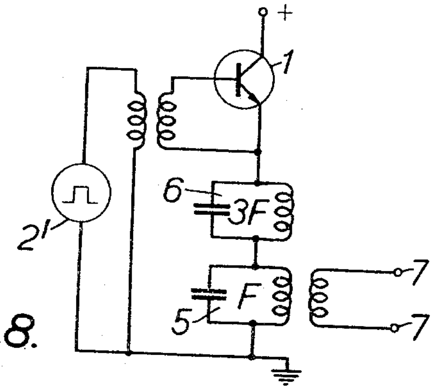

The invention is illustrated in the accompanying drawings in which FIG. 1 shows diagrammatically a single ended embodiment of the invention; FIG. 2 is a set of explanatory waveforms for the embodiment of FIGURE 1; FIGS. 3 and 4 show other single ended embodiments of the invention; FIGS. 5 and 6 show push-pull embodiments of the invention; and FIG. 7 is an explanatory representation of a wave form; and FIG. 8 shows a modification of FIG. 4. FIG. 9 shows the provision of one or more tuned circuits resonant at harmonics higher than the third. Like references denote like parts throughout.

Referring to FIG. 1, a transistor 1 in class C operation amplifies signals from a signal source 2 of fundamental or signal frequency F which is conventionally represented as a sinusoidal source. The source is coupled to a tuned circuit 3 resonant at frequency F and coupled in the base circuit of transistor 1 in series with a bias source 4. The value of bias source 4 is selected to provide an angle of current flow in the drive to the base of the transistor of substantially 120°. The collector circuit of the transistor includes in series therewith two tuned circuits 5 and 6 resonant respectively at F and 3F. One or more additional tuned circuits (e.g. circuit 13 of FIG. 9) resonant at harmonics higher than the third may be provided in series with the two circuits 5 and 6 if desired. Output is taken at terminals 7 from across the circuit 5.

FIG. 2 shows the main wave forms in the circuit of FIG. 1. The full line curve in the upper part of FIG. 2 shows the collector voltage wave form as a function of time and the broken line curve shows the fundamental frequency (F) component. The lower part of FIG. 2 shows the collector current wave form as a function of time. The relatively low peak current and relatively high mean current will be noted. If additional higher harmonic circuits are provided as described above, a wave form squarer than that shown in FIG. 2 will result.

In the modification shown in FIG. 3, the bias source 4 is dispensed with and required nature of base drive is obtained by including in the base circuit two tuned circuits 3 and 8 resonant respectively at F and 3F, the former being coupled to signal source 2. In other respects, FIGS. 1 and 3 are alike. As in FIG. 1, one or more higher harmonic resonant circuits may be added in series with circuits 3 and 8 if required.

In FIG. 4 the source, here referenced 2', is a rectangular wave form source (as conventionally represented by the wave form thereon) for giving the required 120° angle of current flow of drive, and is transformer coupled to the transistor base.

The push-pull modifications of FIGS. 5 and 6 will it is thought, be almost self-evident from the figures. In FIGS. 5 and 6 the signal source is not shown and terminals 9 represent terminals at which the base drive is applied.

In FIG. 5 there are two transistors 1 and 1' of the same type. They have a common grounded emitter connection. Base drive is applied by a transformer 10 with a centre-tapped secondary, the winding sense being indicated by the usual "dot" convention. In each collector circuit is a tuned circuit 6 or 6' resonant at 3F and output is taken via a transformer 11 with a centre tapped primary and a secondary resonant at F as indicated. Again, one or more higher harmonic circuits may be provided in series with the circuits 6 and 6' shown.

FIG. 6 shows a modification of FIG. 5 in which simplification and consequent economy are achieved by using two transistors 1 and 1' of opposite types, i.e. one is of the NPN type and the other of the PNP type. This enables a common collector circuit to be used with only two resonant circuits, 5 and 6, resonant at F and 3F respectively, in that circuit. As before, however, one or more additional higher harmonic circuits may be provided in series with circuits 5 and 6 if required. The condenser 12 should be large enough to prevent any appreciable voltage swing occurring at its live side.

The required angle of current flow for the drive input to the transistors in FIGS. 5 and 6 can be obtained by any of the methods already described with reference to single ended amplifiers. FIG. 7 shows the form of wave which should be used if the angle is obtained (as in FIG. 4) by a rectangular wave form.

It will be noted that the push-pull embodiments of the invention required only one supply and that the current taken therefrom will be of good uniformity; they are capable of giving large output powers; they are economical in components (especially FIG. 6); the second harmonic component is low; and, in FIG. 6, if the power is high enough to warrant the use of heat sinks for the transistors, both collectors can be mounted on the same heat sink.

It will be observed that, in FIG. 6, there is no bias-providing path to the collectors except through the transistors, and because of this, any difference between the transistors results in a change in mean level tending to compensate and balance the circuit. Therefore, although the characteristics of the two transistors employed should be similar, they need not be identical. This is a considerable practical advantage.

FIGS. 1, 3, 4 and 5 are shown as comprising transistors of the NPN type. Obviously PNP type transistors could be used with suitable changes in supply potential polarities.

In FIGS. 1, 3 and 4, the tuned circuits 5 and 6 resonant respectively at F and 3F are in the collector circuit of the transistor. Obviously, electrically equivalent circuits could be constructed with these resonant circuits in the emitter circuit.

FIG. 8, which requires no further description, shows, by way of example, FIG. 4 modified in this manner.

We claim:

1. A push-pull amplifier comprising two transistors of the same conductivity type having interconnected emitters, means for applying input signals of a given frequency to the bases of said transistors, a tuned circuit resonant at three times the signal frequency in the collector circuit of each transistor, and a single tuned circuit resonant at the signal frequency coupled to the output of both transistors to provide a common push-pull output, said means for applying input signals being adapted to produce a relatively low value of peak transistor current and a relatively high value of mean transistor current, thereby providing high efficiency of operation and high peak power capacity for said transistor.

2. A push-pull amplifier comprising two transistors of opposite conductivity type having interconnected collectors, means for applying input signals of a given frequency to the bases of said transistors, and a common collector circuit including a first tuned circuit resonant at the signal frequency in series with a second tuned circuit resonant at three times the signal frequency, said means for applying input signals being adapted to produce a relatively low value of peak transistor current and a relatively high value of mean transistor current, thereby providing high efficiency of operation and high power capacity for said transistors.

References Cited

UNITED STATES PATENTS

| | | | |
|---|---|---|---|
| 2,321,376 | 6/1943 | Finch | 333—76 |
| 2,469,598 | 5/1949 | Harris | 330—122 |
| 2,498,711 | 2/1950 | Royden | 330—122 X |
| 2,936,420 | 5/1960 | Tyler | 333—76 X |
| 3,068,424 | 12/1962 | Orloff et al. | 330—31 X |
| 3,115,582 | 12/1963 | Yoshii et al. | 330—18 X |

FOREIGN PATENTS

| | | |
|---|---|---|
| 218,457 | 11/1958 | Australia. |
| 534,657 | 12/1956 | Canada. |

ROY LAKE, *Primary Examiner.*

F. D. PARIS, S. H. GRIMM, *Assistant Examiners.*